United States Patent
Tao et al.

(10) Patent No.: US 9,343,125 B2
(45) Date of Patent: *May 17, 2016

(54) MEMORY MACRO WITH A VOLTAGE KEEPER

(71) Applicant: TAIWAN SEMICONDUCTOR MANUFACTURING COMPANY LTD., Hsinchu (TW)

(72) Inventors: Derek C. Tao, Fremont, CA (US); Bing Wang, Palo Alto, CA (US); Allen Fan, Los Altos, CA (US); Yukit Tang, San Jose, CA (US); Annie-Li-Keow Lum, San Jose, CA (US); Kuoyuan Hsu, San Jose, CA (US)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/620,769

(22) Filed: Feb. 12, 2015

(65) Prior Publication Data

US 2015/0162060 A1 Jun. 11, 2015

Related U.S. Application Data

(63) Continuation of application No. 13/949,664, filed on Jul. 24, 2013, now Pat. No. 8,988,948.

(51) Int. Cl.
*G11C 7/10* (2006.01)
*G11C 7/12* (2006.01)
*G11C 8/00* (2006.01)
*G11C 7/18* (2006.01)
*G11C 11/419* (2006.01)

(52) U.S. Cl.
CPC .. *G11C 7/12* (2013.01); *G11C 7/18* (2013.01); *G11C 8/00* (2013.01); *G11C 11/419* (2013.01)

(58) Field of Classification Search
CPC .............. G11C 7/12; G11C 8/08; G11C 7/18; G11C 11/149
USPC ............ 365/189.06, 189.05, 189.11, 63, 203, 365/226
See application file for complete search history.

(56) References Cited

U.S. PATENT DOCUMENTS

| | | | | | |
|---|---|---|---|---|---|
| 5,600,271 | A | * | 2/1997 | Erickson | H03K 19/018585 327/108 |
| 6,181,611 | B1 | * | 1/2001 | Liu | G11C 8/08 365/189.06 |
| 7,061,820 | B2 | * | 6/2006 | Deng | G11C 11/417 365/189.09 |
| 2014/0146629 | A1 | * | 5/2014 | Lum | G11C 11/419 365/226 |
| 2014/0307500 | A1 | * | 10/2014 | Su | G11C 11/419 365/154 |

* cited by examiner

*Primary Examiner* — Gene Auduong
(74) *Attorney, Agent, or Firm* — WPAT, P.C., Intellectual Property Attorneys; Anthony King

(57) ABSTRACT

A memory macro includes a first data line, a second data line, a first switch and a voltage keeper. The first switch is configured between the first data line and the second data line. The voltage keeper is electrically coupled to the second data line. The voltage keeper is configured to control a voltage level at the second data line in response to the voltage level at the second data line during the first switch electrically couples the second data line to the first data line.

20 Claims, 7 Drawing Sheets

| | ARRAY | | ARRAY | |
|---|---|---|---|---|
| | Left Core Bank 3 | XD | Right Core Bank 3 | |
| SEG2 | LIO | LCTRL | LIO | |
| | Left Core Bank 2 | XD | Right Core Bank 2 | |
| | Left Core Bank 1 | | Right Core Bank 1 | |
| SEG1 | LIO | LCTRL | LIO | |
| | Left Core Bank 0 | XD | Right Core Bank 0 | |
| | GIO | GCTRL | GIO | |

100

MEMORY MACRO WITH A VOLTAGE KEEPER

PRIORITY CLAIM AND CROSS-REFERENCE

This application is a continuation application of U.S. application Ser. No. 13/949,664 filed on Jul. 24, 2013, the disclosure of which is hereby incorporated by reference in its entirety.

TECHNICAL FIELD

The present disclosure is related to a memory macro with a voltage keeper.

BACKGROUND

A voltage keeper refers to a circuit that keeps a node at a particular logical value, such as a high logical value, in a memory macro application, for example. On one hand, the voltage keeper is designed to keep the node at the high logical value while other circuits in the memory macro tend to pull the node away from the high logical value. In such a situation, the voltage keeper needs to be stronger than the other circuits. On the other hand, when the node changes to a low logical value, the voltage keeper needs to be weaker than the other circuits for the node to transition to such a low logical value. In some approaches, to cover manufacturing process variations, multiple voltage keepers are implemented in different sections of the memory macro. Further, a transistor length of transistors implemented as the voltage keeper is relatively large, which affects poly pattern accuracy of the memory array in the memory macro and of other transistors close to the area of the voltage keeper. A large die area of the voltage keeper also reduces efficiency of the memory cells.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAIL DESCRIPTION

Figure 1:
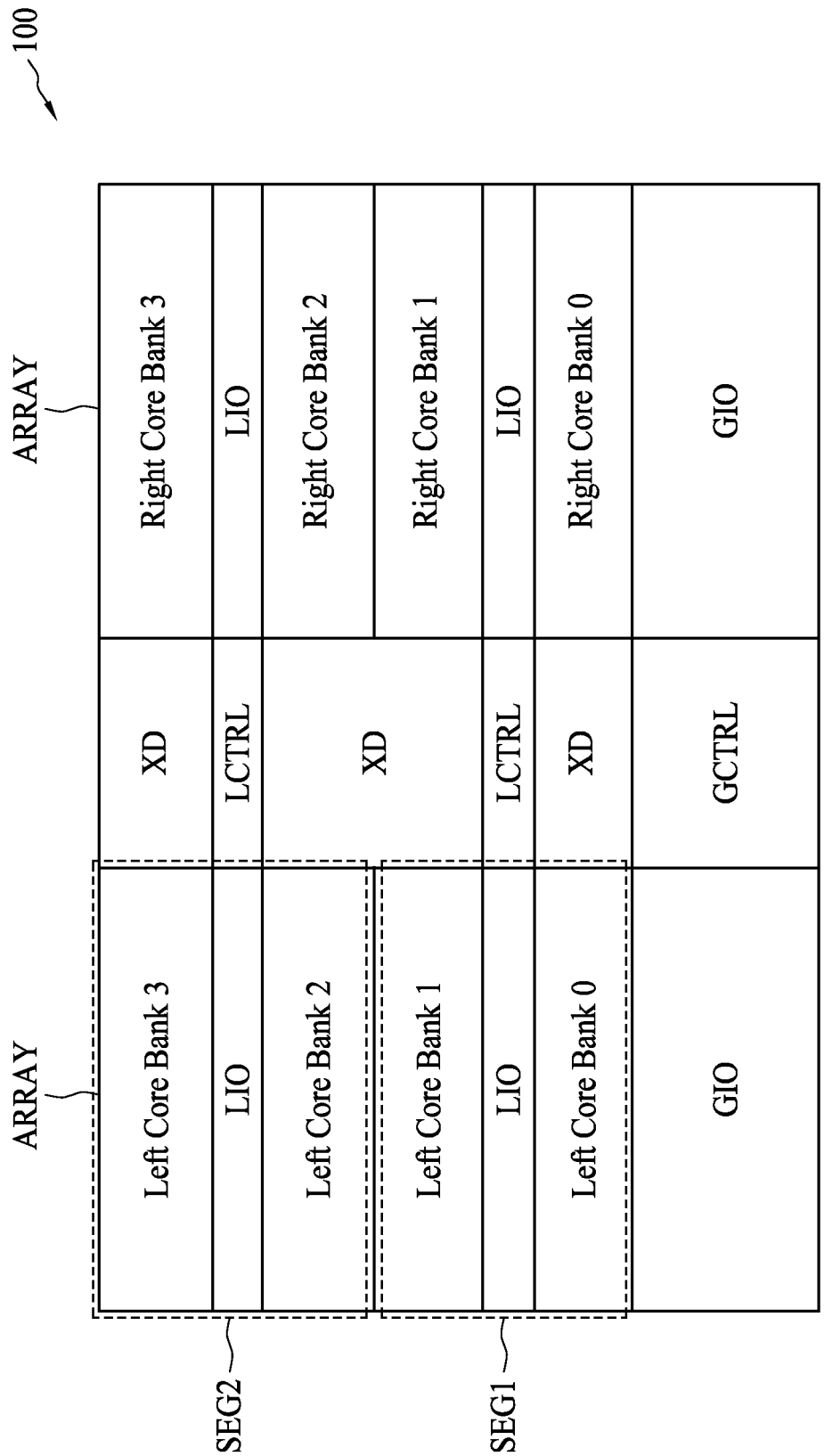
FIG. 1 is a diagram of a memory macro, in accordance with some embodiments.

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numbers may be repeated throughout the embodiments, but this does not necessarily require that feature(s) of one embodiment apply to another embodiment, even if they share the same reference number.

Memory Macro

FIG. 1 is a diagram of a memory macro 100, in accordance with some embodiments. In FIG. 1, memory macro 100 is a static random access memory (SRAM) macro. Other types of memories are within the scope of various embodiments.

Memory macro 100 has a symmetrical structure. For example, with reference to decoders XD, local control circuits (LCTRLs), and a global control circuit (GCTRL), circuit elements on the left side are similar to circuit elements on the right side of memory macro 100. For another example, memory macro 100 includes two memory arrays ARRAY. One memory array is on the left side and one memory array is on the right side of memory macro 100.

Each memory array ARRAY includes a plurality of memory segments. For illustration, two memory segments SEG1 and SEG2 of memory array ARRAY on the left of memory macro 100 are shown. A different number of memory segments is within the scope of various embodiments.

Each memory segment includes two core banks (e.g., memory banks). For example, memory segment SEG1 includes two core banks Bank0 and Bank1, and memory segment SEG2 includes two core banks Bank2 and Bank3. For illustration, only memory segments SEG1 and SEG2 are labeled. Details of other core banks Bank0, Bank1, Bank2, and Bank3 on the right of other memory segments are not labeled.

In a memory segment, two core banks share a row of a local interface circuit, for example, a local input-output circuit LIO. As an example, core banks Bank0 and Bank1 on either the left or right side of memory segments share one LIO, and core banks Bank2 and Bank3 on either the left or right side of memory segments share one LIO.

Memory cells in a core bank are arranged in rows and columns. As a result, memory cells in a memory segment and in a memory array ARRAY are also arranged in rows and columns. A memory cell is described with reference to FIG. 2 below, and is labeled MEMCELL. Different configurations of a memory segment are within the scope of various embodiments.

An address decoder XD provides the row-address of corresponding memory cells to be accessed for a read or a write operation. A local control LCTRL controls a corresponding local LIO. A global interface circuit, for example, a global input-output circuit GIO serves to transfer data between memory cells in a corresponding memory array and other circuits outside of memory macro 100. Global control GCTRL provides the row address, the column address predecoded, clock, and other signals for memory macro 100. Global control GCTRL also controls data transfer between memory cells in the memory array and circuits outside of memory macro 100.

Memory Cell

Figure 2:
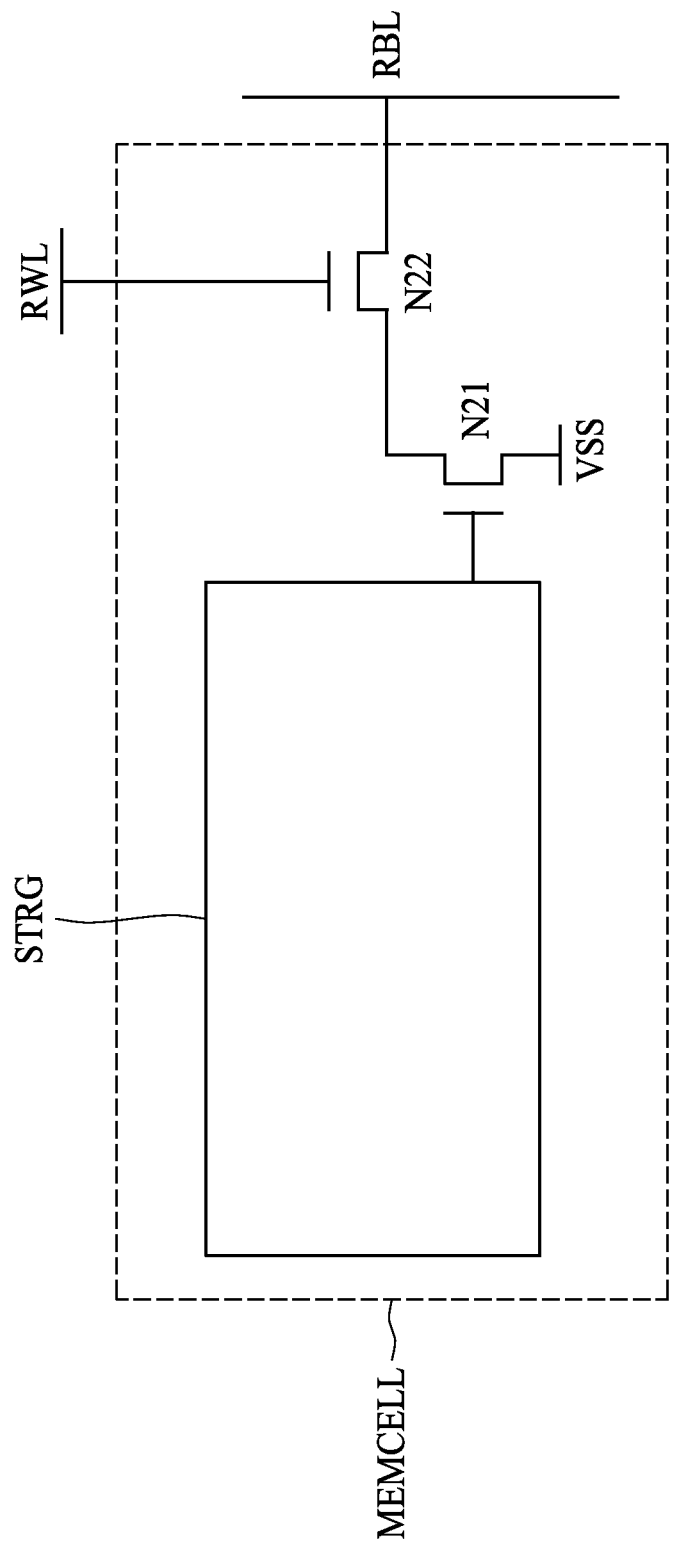
FIG. 2 is a diagram of a memory cell of the memory macro in FIG. 1, in accordance with some embodiments.

FIG. 2 is a diagram of a memory cell MEMCELL coupled with a read word line RWL and a read bit line RBL, in accordance with some embodiments.

Memory cell MEMCELL includes a storage unit STRG and a read port that includes two N-type metal-oxide-semiconductor (NMOS) transistors N21 and N22.

A gate of transistor N21 receives data from storage unit STRG. A source of transistor N21 receives a supply reference voltage VSS, which, in some embodiments, is ground. A drain of transistor N21 is coupled with a source of transistor N22. A gate of transistor N22 is coupled with read word line RWL. A drain of transistor N22 is coupled with read bit line RBL. In some embodiments, read word line RWL is coupled with gates of transistors N22 in a row of memory cells MEMCELL in a core bank. Further, read bit line RBL is coupled with drains of transistors N22 in a column of memory cells MEMCELL in a core bank.

When memory cell MEMCELL is accessed for a read operation, detecting a logical value on read bit line RBL reveals the logical data stored in memory MEMCELL. For example, in some embodiments, in a read operation, read bit line RBL is pre-charged with a high logical value. Pre-charge refers to charging before a read or a write operation. Read word line RWL is then activated with a high logical value. As a result, transistor N22 is turned on. In some embodiments, when storage unit STRG stores a high logical value, storage unit STRG provides a low logical value to the gate of transistor N21. Consequently, transistor N21 is turned off, and transistors N21 and N22 function as an open circuit. Read bit line RBL therefore remains at the pre-charged high logical value. In other words, the high logical value on read bit line RBL corresponds to the high logical data stored in storage unit STRG. In contrast, when storage unit STRG stores a low logical value, storage unit STRG provides a high logical value to the gate of transistor N21. As a result, transistor N21 is turned on. Because transistors N21 and N22 are turned on, read bit line RBL is pulled to a low logical value at the source of transistor N21. In other words, the low logical value on read bit line RBL corresponds to the low logical data stored in storage unit STRG. Different values stored in storage unit STRG and provided to the gate of transistor N21 are within the contemplated scope of the present disclosure.

Read word line RWL is also called a control line because read word line RWL controls the transfer of data in memory cell MEMCELL to read bit line RBL. Read bit line RBL is also called a data line because read bit line RBL carries or reflects the data stored in memory cell MEMCELL.

LIOs and GIO Associated with a Memory Array

Figure 3:
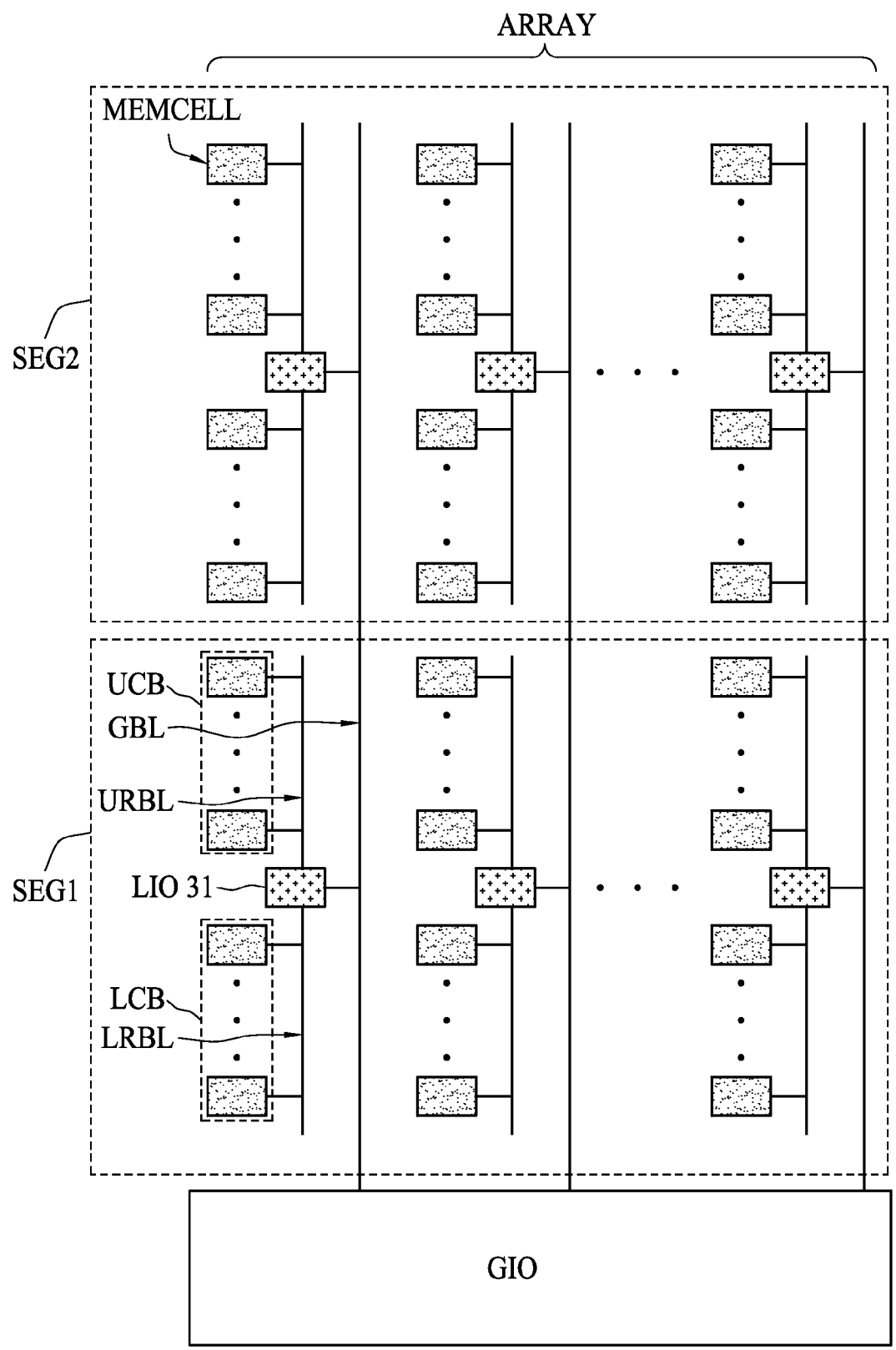
FIG. 3 is a diagram illustrating local input/output (LIO) circuits and a global input/output (GIO) circuit associated with a memory array of the memory macro in FIG. 1, in accordance with some embodiments.

FIG. 3 is a diagram illustrating LIOs and GIO associated with a memory array ARRAY of memory macro 100 in FIG. 1, in accordance with some embodiments. As illustratively shown in FIG. 3, memory array ARRAY comprises segments SEG1 and SEG2 each in turn comprising LIOs and core banks. Each core bank includes a plurality of memory cells MEMCELL.

As previously discussed with reference to FIG. 1, two core banks share an LIO. As shown in segment SEG1 of FIG. 3, an exemplary LIO 31 is coupled with an upper core bank UCB via an upper local read bit line URBL, and is coupled with a lower core bank LCB via a lower local read bit line LRBL. Further, LIO 31 is coupled with a GIO via a global bit line GBL. A global bit line GBL is also called a global data line. An upper local read bit line URBL is also called an upper local data line, and a lower local read bit line LRBL is also called a lower local data line. Upper local read bit line URBL and lower local read bit line LRBL are collectively called local data lines.

Figure 4:
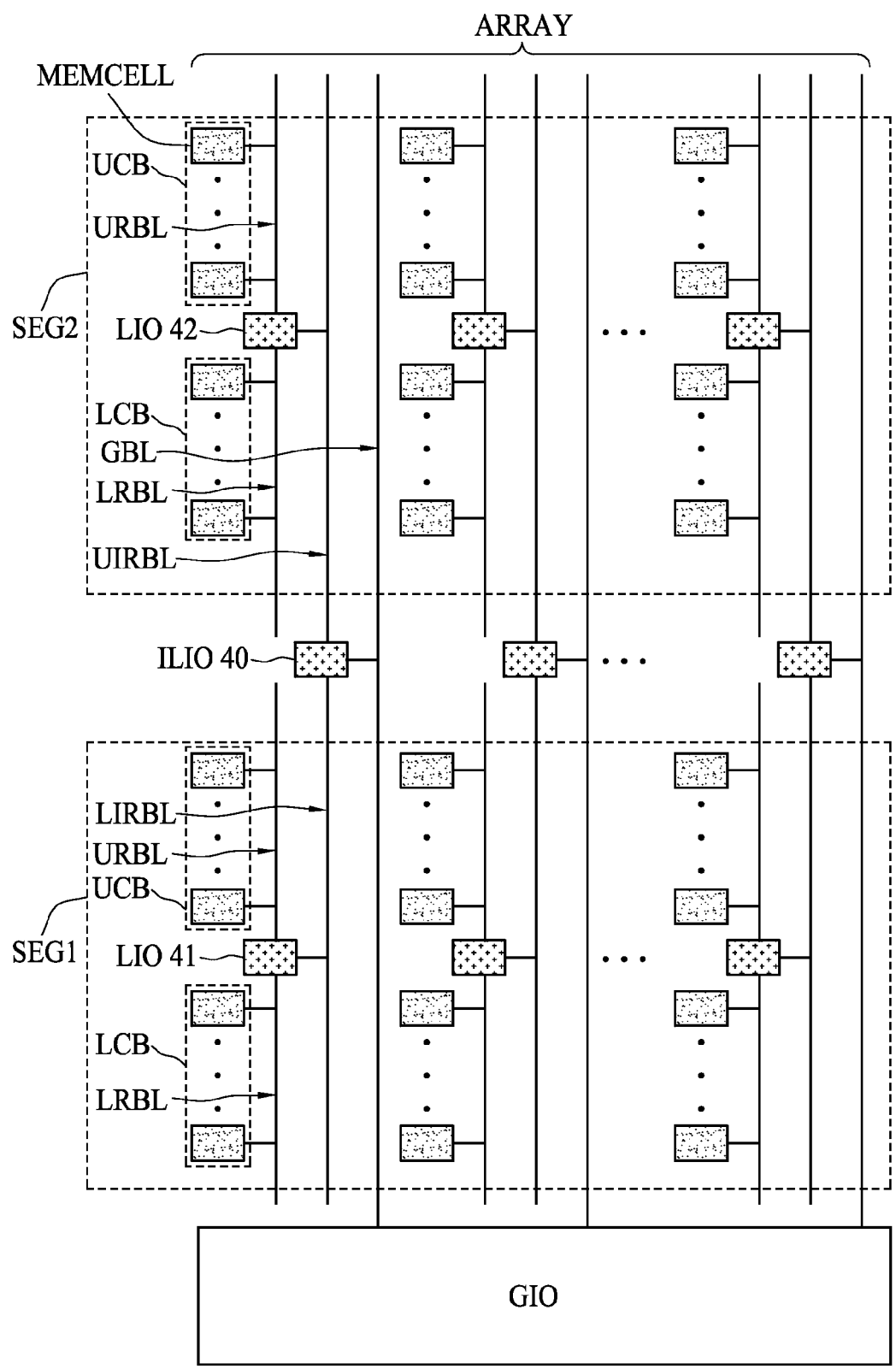
FIG. 4 is a diagram illustrating LIOs and GIO associated with a memory array of a memory macro in FIG. 1, in accordance with additional embodiments.

FIG. 4 is a diagram illustrating LIOs and GIO associated with a memory array ARRAY of memory macro 100 in FIG. 1, in accordance with additional embodiments. In FIG. 4, memory array ARRAY comprises LIOs, intermediate LIOs (ILIOs) and core banks each including a plurality of memory cells MEMCELL.

As shown in FIG. 4, an exemplary LIO 41 in segment SEG1 is coupled with an upper core bank UCB via an upper local read bit line URBL, is coupled with a lower core bank LCB via a lower local read bit line LRBL, and is coupled with an ILIO 40 via a lower intermediate read bit line LIRBL. Likewise, an exemplary LIO 42 in segment SEG2 is coupled with another upper core bank UCB via another upper local read bit line URBL, is coupled with another lower core bank LCB via another lower local read bit line LRBL, and is coupled with ILIO 40 via an upper intermediate read bit line UIRBL. Further, ILIO 40 is coupled with LIO 42 via upper intermediate read bit line UIRBL, is coupled with LIO 41 via lower intermediate read bit line LIRBL, and is coupled with a GIO via a global bit line GBL. An upper intermediate read bit line UIRBL is also called an upper intermediate data line, and a lower intermediate read bit line LIRBL is also called a lower intermediate date line. Upper intermediate read bit line UIRBL and lower intermediate read bit line LIRBL are collectively called intermediate date lines.

Upper intermediate read bit lines UIRBLs and lower intermediate read bit lines LIRBLs facilitate data transfer between accessed memory cells and GIO. In some embodiments, an ILIO and corresponding intermediate read bit lines, for example, ILIO 40 and intermediate read bit lines UIRBL and LIRBL, are arranged in a column for data transfer between local read bit lines URBLs, LRBLs and global bit line GBL. In other embodiments, however, more than one ILIOs and their corresponding intermediate read bit lines are arranged in a column for data transfer between local read bit lines URBLs, LRBLs and global bit line GBL. In still other embodiments, ILIOs and their corresponding intermediate read bit lines are arranged in more than one column for data transfer between local read bit lines URBLs, LRBLs and global bit line GBL. Accordingly, one or more ILIO and corresponding intermediate read bit lines arranged in one or more columns between local read bit lines URBLs, LRBLs and global bit line GBL are within the contemplated scope of various embodiments.

LIO Circuit and GIO Circuit

Figure 5:
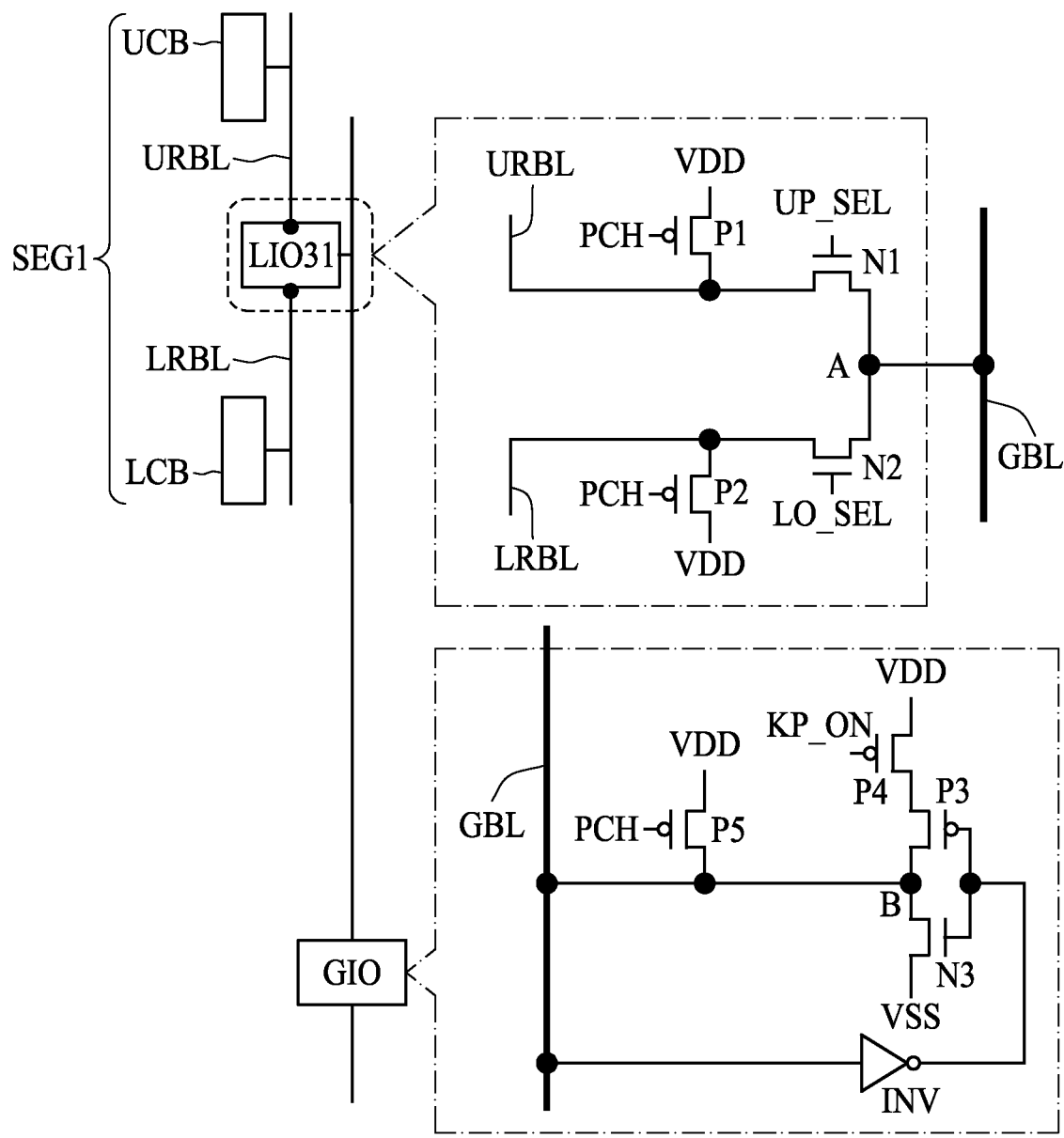
FIG. 5 is a diagram illustrating an LIO and a GIO, in accordance with some embodiments.

FIG. 5 is a diagram illustrating LIO 31 and GIO in FIG. 3, in accordance with some embodiments. LIO 31 includes a symmetrical structure with respect to a node A connected to global bit line GBL.

As shown in FIG. 5, exemplary LIO 31 comprises, in an upper branch, an n-type metal-oxide-semiconductor (NMOS) transistor N1, and a p-type metal-oxide-semiconductor (PMOS) transistor P1, and comprises, in a lower branch, another NMOS transistor N2, and another PMOS transistor P2. In the upper branch of LIO 31, a gate of transistor N1 receives a signal UP_SEL. A drain of transistor N1 is coupled to node A and global bit line GBL. A source of transistor N1 is coupled to upper local read bit line URBL. Upper local read bit line URBL is connected to an upper core bank UCB corresponding to LIO 31. A gate of transistor P1 receives a signal PCH. A source of transistor P1 receives a power voltage VDD. A drain of transistor P1 is coupled to the upper local read bit line URBL and to the source of transistor N1. Signals UP_SEL and PCH are provided by a local control LCTRL corresponding to LIO 31.

In the lower branch of LIO 31, a gate of transistor N2 receives a signal LO_SEL. A drain of transistor N2 is coupled to node A and global bit line GBL. A source of transistor N2 is coupled to lower local read bit line LRBL. Lower local read bit line LRBL is connected to a lower core bank LCB corresponding to LIO 31. A gate of transistor P2 receives a signal PCH. A source of transistor P2 receives a power voltage VDD. A drain of transistor P2 is coupled to the lower local read bit line LRBL and to the source of transistor N2. Signal LO_SEL is provided by the local control LCTRL corresponding to LIO 31.

LIO 31 is configured to detect the logical data stored in an accessed memory cell MEMCELL in an upper core bank UCB, using the upper branch. Data transfer between an accessed memory cell MEMCELL in an upper core bank UCB and GIO is achieved via upper local read bit line URBL, transistor N1, and global bit line GBL. Further, LIO 31 is configured to detect the logical data stored in an accessed memory cell MEMCELL in a lower core bank LCB, using the lower branch. Data transfer between an accessed memory cell MEMCELL in a lower core bank LCB and GIO is achieved via lower local read bit line LRBL, transistor N2, and global bit line GBL. Since the circuits in the upper and lower branches of LIO 31 are symmetrical to each other and achieve substantially the same function, for simplicity, the operation of LIO 31, and the upper branch will be discussed in detail in FIG. 7 below.

GIO comprises complementary transistors including a PMOS transistor P3 and an NMOS transistor N3, an inverter INV and PMOS transistors P4 and P5. A gate of transistor P3 receives an output of inverter INV. A drain of transistor P3 is coupled to a node B and to global bit line GBL. A source of transistor P3 is coupled to a drain of transistor P4. A gate of transistor N3 receives an output of inverter INV and is coupled to the gate of transistor P3. A drain of transistor N3 is coupled to node B, to global bit line GBL and to the drain of transistor P3. A source of transistor N3 receives a supply reference voltage VSS. A gate of transistor P4 receives a control signal KP_ON. A source of transistor P4 receives supply voltage VDD. A drain of transistor P4 is coupled to the source of transistor P3. Control signal KP_ON is provided by global control GCTRL. A gate of transistor P5 receives signal PCH. A source of transistor P5 receives supply voltage VDD. A drain of transistor P5 is coupled to node B, to global bit line GBL, and to the drains of transistors P3 and N3. An input of inverter INV is coupled with global bit line GBL. An output of inverter INV is coupled to the gates of transistors P3 and N3. Transistors P3, N3, P4 and inverter INV serve as a voltage keeper, which maintains a high logical value of node B at VDD at the source of transistor P4 when the logical data stored in an accessed memory cell MEMCELL is logically high. Further, the voltage keeper pulls local read bit line URBL and global bit line GBL to a low logical value faster when the logical data stored in an accessed memory cell MEMCELL is logically low. Operation of LIO 31 and GIO will be discussed with reference to FIG. 7.

LIO Circuit and Intermediate LIO Circuit, Additional Embodiments

Figure 6:
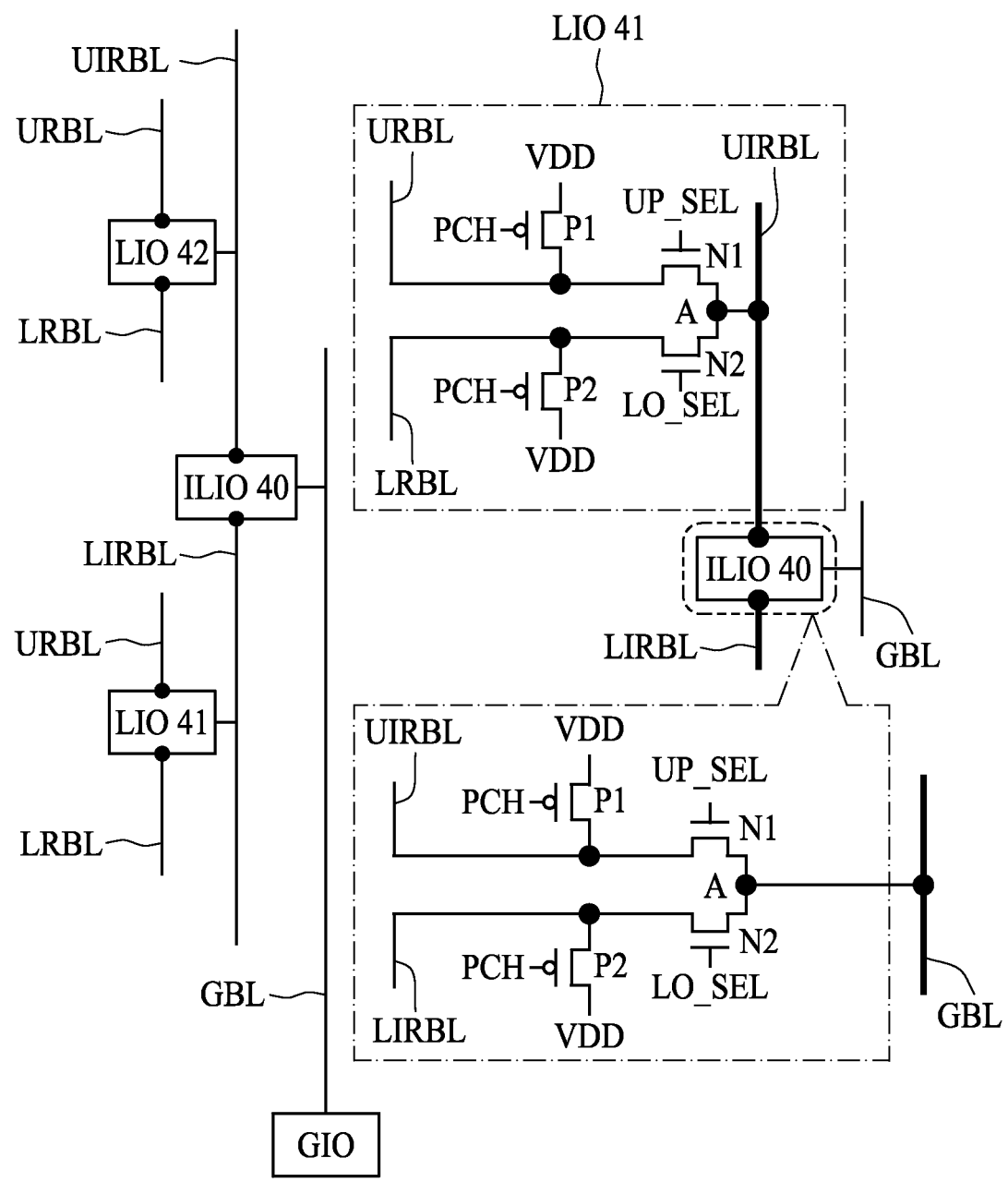
FIG. 6 is a diagram illustrating an LIO and an intermediate LIO (ILIO), in accordance with additional embodiments.

FIG. 6 is a diagram illustrating LIO 41 and intermediate LIO (ILIO) 40 in FIG. 4, in accordance with additional embodiments.

As shown in FIG. 6, exemplary LIO 41 is similar to LIO 31 illustrated and described with reference to FIG. 5 except that, for example, node A at the drains of transistors N1 and N2 of LIO 41 is coupled via an upper intermediate read bit line UIRBL to ILIO 40. As compared to LIO 31, node A at the drains of transistors N1 and N2 of LIO 31 in FIG. 5 is coupled via global bit line GBL to GIO. Accordingly, LIO 41 has a symmetrical structure with respect to node A connected to upper intermediate read bit line UIRBL.

Exemplary ILIO 40 is similar to LIO 31 in FIG. 5 except that, for example, the source of transistor N1 and the drain of transistor P1 are coupled with upper intermediate read bit line UIRBL, while the source of transistor N2 and the drain of transistor P2 are coupled with lower intermediate read bit line LIRBL. Accordingly, ILIO 40 has a symmetrical structure with respect to node A connected to global bit line GBL. Further, data transfer between an accessed memory cell MEMCELL and GIO is achieved via upper local read bit line URBL, transistor N1, upper intermediate read bit line UIRBL, ILIO 40, and global bit line GBL, or via lower local read bit line LRBL, transistor N2, upper intermediate read bit line UIRBL, ILIO 40, and global bit line GBL.

Circuit Operation

Figure 7:
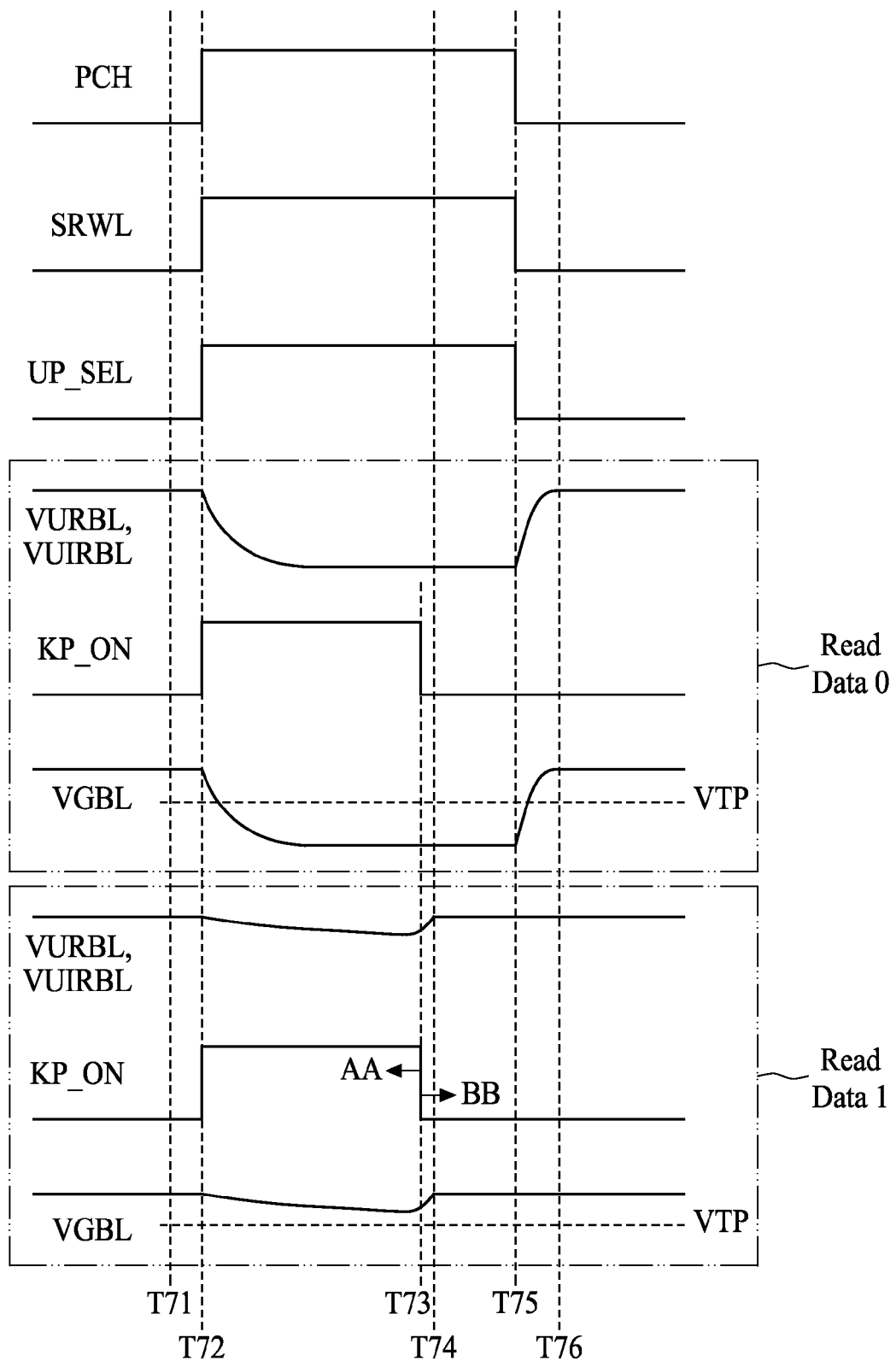
FIG. 7 shows illustrative signals corresponding to exemplary circuits of FIGS. 5 and 6.

FIG. 7 shows illustrative signals corresponding to the exemplary circuits of FIGS. 5 and 6. Since in LIO 31 of FIG. 5, and LIO 41 and ILIO 40 of FIG. 6 circuits in the upper and lower branches are symmetrical to each other and achieve substantially the same function, only the upper branches in LIO 31, LIO 41 and ILIO 40 are explained with reference to FIG. 7.

At time T71, to prepare for a read access, in LIO 31 in FIG. 5 signal PCH is activated with a low logical value to turn on transistor P1. Signal SRWL, which is sent to read word line RWL in FIG. 2, is deactivated with a low logical value to turn off transistor N22 in FIG. 2. Signal UP_SEL is deactivated with a low logical value to turn off transistor N1. As a result, transistor P1 charges upper local read bit line URBL to VDD at the source of transistor P1. Since transistor N1 is turned off, global bit line GBL is not affected by circuits in LIO 31.

In GIO the activated signal PCH turns on transistor P5. As a result, transistor P5 charges global bit line GBL to VDD at the source of transistor P5. By operation of inverter INV, the output of inverter INV is logically low, which turns on transistor P3 and turns off transistor N3. Control signal KP_ON at time T71 is activated with a low logical value to turn on transistor P4. Since transistors P4 and P3 are turned on, transistors P4 and P3 maintain the high logical value of node B at VDD at the drain of transistor P4. Further, since node A, node B and global bit line GBL are coupled together, node A, node B and global bit line GBL have the same logical value. As a result, transistors P4 and P3 also maintain the high logical value of node A and global bit line GBL at VDD at the drain of transistor P4.

At time T72, signal SRWL is activated with a high logical value to turn on transistor N22 in FIG. 2. Accordingly, memory cell MEMCELL is accessed. In LIO 31 signal PCH is deactivated with a high logical value to turn off transistor P1. Further, signal UP_SEL is activated with a high logical value to turn on transistor N1, which, in effect, electrically connects global bit line GBL to upper local read bit line URBL. Furthermore, in GIO, the deactivated signal PCH turns off transistor P5. Control signal KP_ON is deactivated with a high logical value to turn off transistor P4.

If at time T72 memory cell MEMCELL stores a low logical value, represented as data 0, transistor N21 is turned on as previously discussed with reference to FIG. 2. Since transistors N21 and N22 are turned on, transistors N21 and N22 pull upper local read bit line URBL to a low logical value VSS at the source of transistor N21. Further, since transistor N1 is turned on and upper local read bit line URBL is electrically connected with global bit line GBL, global bit line GBL is also pulled to the low logical value VSS at the source of transistor N21. As a result, as shown in FIG. 7, a voltage level VURBL at upper local read bit line and a voltage level VGBL at global bit line start to decrease at time T72. The low logical value on upper local read bit line URBL and on global bit line GBL corresponds to the low logical value stored in storage unit STRG of the accessed memory cell MEMCELL.

As the voltage level of VGBL and at node B is lower than a voltage trip point VTP, for example, ½ VDD, the logical value of VGBL and node A changes from a high to a low logical value. Consequently, by operation of inverter INV, the output of inverter INV changes from a low to a high logical value, which turns on transistor N3 and turns off transistor P3. As a result, global bit line GBL and upper local read bit line URBL are pulled to a low logical value at the source of transistor N3. Effectively, transistor N3 helps transistor N21 to pull upper local read bit line URBL and global bit line GBL to a low logical value faster.

At time T73, control signal KP_ON in FIG. 5 is activated with a low logical value, which turns on transistor P4. Since data stored in storage unit STRG of accessed memory cell MEMCELL is logically low, VGBL and VURBL are pulled to be logically low. By operation of inverter INV, the output of inverter INV is logically high, which turns off transistor P3. Since transistor P3 is turned off, transistors P3 and P4 function as an open circuit and VGBL and VURBL are not affected.

Subsequently, at time T75, signals SRWL and UP_SEL are deactivated with a low logical value, which turns off transistor N22 in FIG. 2 and N1 in FIG. 6. Since transistors N22 and N1 are turned off, global bit line GBL is electrically disconnected from upper local read bit line URBL. Further, at time T75, signal PCH is activated with a low logical value, which turns on transistors P1 in LIO 31 and P5 in GIO. Since transistors P1 and P5 are turned on, at time T76 upper local read bit line URBL and global bit line GBL are pulled to VDD at the drain of transistor P1 and the drain of transistor P5, respectively.

In contrast, if at time T72 memory cell MEMCELL stores a high logical value, represented as data 1, transistor N21 in FIG. 2 is turned off and transistors N21 and N22 function as an open circuit. As a result, upper local read bit line URBL and global bit line GBL in FIG. 5 remain at the pre-charged high logical value. However, due to leakage current, voltage level VURBL of upper local read bit line URBL and voltage level VGBL of global bit line GBL gradually decrease at time T72 over time, as shown in FIG. 7. In situations when VGBL decreases below VTP, data stored in storage unit STRG of accessed memory cell MEMCELL is misread. As previously discussed, signals SRWL and UP_SEL are activated at time T72 to turn on transistors N22 and N1, and global bit line GBL is electrically connected to upper local read bit line URBL. However, signals SRWL and UP_SEL are not deactivated until time T75. As a result, during the period from time T72 to time T75, if data stored in storage unit STRG of an accessed memory cell MEMCELL is logically high, misreading may occur in the case of severe leakage current. To address the issue, time of activation of control signal KP_ON is configured to be adjustable in a time period between time T72 and time T75, where misreading may occur. In some embodiments, control signal KP_ON is activated at a time earlier than T73, as shown in an arrowhead AA. In other embodiments, control signal KP_ON is activated at a time later than T73, as shown in an arrowhead BB. By activating control signal KP_ON prior to the deactivation of signals SRWL and UP_SEL at time T75, misreading is prevented.

Accordingly, since data stored in storage unit STRG of accessed memory cell MEMCELL is logically high, activation of control signal KP_ON at time T73 ensures that VGBL and VURBL still have a logical high value and do not decrease below VTP. By operation of inverter INV in FIG. 5, the output of inverter INV is logically low, which turns on transistor P3. Since transistors P3 and P4 are turned on, at time T74, VGBL and VURBL are pulled to VDD at the drain of transistor P3. At time T75, circuit operation for logically high data stored in storage unit STRG is the same as that for logically low data and is not further discussed.

The above circuit operation with reference to LIO 31 is also applicable to LIO 41 and ILIO 40 in FIG. 6. Since LIO 41 and ILIO 40 are similar to LIO 31 in FIG. 5, circuit operation of FIG. 6 is briefly discussed below with reference to FIG. 7.

At time T71, in LIO 41 in FIG. 6, signal SRWL is deactivated with a low logical value, signal UP_SEL is deactivated with a low logical value, signal PCH is activated with a low logical value, and control signal KP_ON is activated with a low logical value. As a result, in LIO 41, upper local read bit line URBL is electrically disconnected from upper intermediate read bit line UIRBL. Further, upper local read bit line URBL is pulled to VDD at the drain of transistor P1. In ILIO 40, upper intermediate read bit line UIRBL is electrically disconnected from global bit line GBL. Accordingly, upper local read bit line URBL, intermediate read bit line UIRBL and global bit line GBL are electrically disconnected from one another. Further, upper intermediate read bit line UIRBL is pulled to VDD at the drain of transistor P1. In GIO, global bit line GBL is pulled to VDD at the source of transistor P5.

At time T72, signal SRWL is activated with a high logical value to turn on transistor N22 in FIG. 2, signal UP_SEL is activated with a high logical value, signal PCH is deactivated with a high logical value, and control signal KP_ON is deactivated with a high logical value. As a result, a memory cell MEMCELL is accessed. In LIO 41, upper local read bit line URBL is electrically connected to upper intermediate read bit line UIRBL. In ILIO 40, upper intermediate read bit line UIRBL is electrically connected to global bit line GBL. Accordingly, upper local read bit line URBL, intermediate read bit line UIRBL and global bit line GBL are electrically connected to one another.

If at time T72 memory cell MEMCELL stores a low logical value, transistor N21 in FIG. 2 is turned on. Since transistors N21 and N22 are turned on, transistors N21 and N22 pull upper local read bit line URBL to a low logical value VSS at the source of transistor N21. Further, since transistor N1 in FIG. 6 is turned on and upper local read bit line URBL is electrically connected with upper intermediate read bit line UIRBL and global bit line GBL, upper intermediate read bit line UIRBL and global bit line GBL are also pulled to the low logical value VSS at the source of transistor N21 in FIG. 2. As a result, as shown in FIG. 7, VURBL, VUIRBL and VGBL start to decrease at time T72. The low logical value on upper local read bit line URBL, on upper intermediate read bit line UIRBL and on global bit line GBL corresponds to the low logical value stored in storage unit STRG of the accessed memory cell MEMCELL.

As the voltage level of VGBL and at node B in FIG. 5 is lower than a voltage trip point VTP, the logical value of VGBL changes from a high to a low logical value. Consequently, by operation of inverter INV, the output of inverter INV changes from a low to a high logical value, which turns on transistor N3 and turns off transistor P3 in GIO. As a result, global bit line GBL, upper intermediate read bit line UIRBL and upper local read bit line URBL are pulled to a low logical value at the source of transistor N3. Effectively, transistor N3 helps transistor N21 to pull upper local read bit line URBL, upper intermediate read bit line UIRBL and global bit line GBL to a low logical value faster.

At time T73, control signal KP_ON is activated with a low logical value, which turns on transistor P4. Since data stored in storage unit STRG of accessed memory cell MEMCELL is logically low, VGBL, VUIRBL and VURBL are pulled to logically low. By operation of inverter INV, the output of inverter INV is logically high, which turns off transistor P3. Since transistor P3 is turned off, transistors P3 and P4 function as an open circuit and VGBL, VUIRBL and VURBL are not affected.

Subsequently, at time T75, signals SRWL and UP_SEL are deactivated with a low logical value, which turns off transistors N22 and N1. Since transistors N22 and N1 are turned off, global bit line GBL, upper intermediate read bit line UIRBL and upper local read bit line URBL are electrically disconnected from one another. Further, at time T75, signal PCH is activated with a low logical value, which turns on transistors P1 in LIO 41 and ILIO 40 and turns on transistor P5 in GIO. Since transistors P1 and P5 are turned on, at time T76 upper local read bit line URBL and upper intermediate read bit line UIRBL are pulled to VDD at the drain of transistors P1 and global bit line GBL is pulled to VDD at the drain of transistor P5.

In contrast, if at time T72 memory cell MEMCELL stores a high logical value, transistor N21 is turned off and transistors N21 and N22 function as an open circuit. As a result, upper local read bit line URBL, upper intermediate read bit line UIRBL and global bit line GBL remain at the pre-charged high logical value. However, due to leakage current, VURBL, VUIRBL and VGBL gradually decrease at time T72 over time, as shown in FIG. 7.

Accordingly, since data stored in storage unit STRG of accessed memory cell MEMCELL is logically high, activation of control signal KP_ON at time T73 ensures that VGBL, VUIRBL and VURBL still have a logical high value and do not decrease below VTP. By operation of inverter INV, the output of inverter INV is logically low, which turns on transistor P3. Since transistors P3 and P4 are turned on, at time T74, VGBL, VUIRBL and VURBL are pulled to VDD at the drain of transistor P3. At time T75, circuit operation for logically high data stored in storage unit STRG is the same as that for logically low data and is not further discussed.

In some embodiments, in a memory macro including a memory array, a plurality of first data lines associated with memory cells of the memory array, and a second data line associated with the memory array, a circuit comprises a first switch. The first switch is configured between a first one of the first data lines and a second data line. The first switch is configured to electrically couple the second data line to the first one of the first data lines when a memory cell associated with the first one of the first data lines is accessed.

In some embodiments, a memory macro includes a data line, a first switch, a second switch and a third switch. The first switch is configured between the data line and a supply voltage and configured to be turned on or off in response to a voltage level at the data line. The second switch is configured between the data line and a supply reference voltage and configured to be turned on or off in response to the voltage level at the data line. The third switch is connected in series with the first switch and configured to be turned on or off in response to a control signal. The control signal is configured to cause the third switch to be turned off during a first time period larger than a second time period a voltage level at the data line is caused to be pulled down by the turned-on second switch and smaller than a third time period the voltage level at the data line is pulled down by the turned-off second switch.

In some embodiments, a memory macro includes a first data line, a second data line, a first switch and a voltage keeper. The first switch is configured between the first data line and the second data line. The voltage keeper is electrically coupled to the second data line. The voltage keeper is configured to control a voltage level at the second data line in response to the voltage level at the second data line during the first switch electrically couples the second data line to the first data line.

A number of embodiments of the disclosure have been described. It will nevertheless be understood that various modifications may be made without departing from the spirit and scope of the invention. For example, some transistors are shown to be N-type and some others are shown to be P-type, but the disclosure is not limited to such a configuration. Embodiments of the disclosure are applicable in variations and/or combinations of transistor types. Additionally, some signals are illustrated with a particular logic level to operate some transistors (e.g., activated high, deactivated low, etc.). Different logic levels are within the contemplated scope of the present disclosure.

The above description includes exemplary steps, but these steps are not necessarily required to be performed in the order shown. Steps may be added, replaced, changed order, and/or eliminated as appropriate, in accordance with the spirit and scope of the invention. Accordingly, the scope of the invention should be determined with reference to the following claims, along with the full scope of equivalences to which such claims are entitled.

What is claimed is:

1. In a memory macro comprising a memory array, a plurality of first data lines associated with memory cells of the memory array, and a second data line associated with the memory array, a circuit comprising:
   a first switch configured between a first one of the first data lines and a second data line,
   wherein the first switch is configured to electrically couple the second data line to the first one of the first data lines when a memory cell associated with the first one of the first data lines is accessed.

2. The circuit of claim 1 further comprising a first charging device configured to charge the first one of the first data lines.

3. The circuit of claim 1 further comprising a second switch configured between a second one of the first data lines and the second data line, wherein the second switch is configured to electrically couple the second data line to the second one of the first data lines when a memory cell associated with the second one of the first data lines is accessed.

4. The circuit of claim 3 further comprising a second charging device configured to charge the second one of the first data lines.

5. The circuit of claim 1 further comprising at least one intermediate data line between the second data line and one of the first data lines,
   wherein the first switch is configured between the at least one intermediate data line and the second data line.

6. A memory macro comprising:
   a data line;
   a first switch configured between the data line and a supply voltage and configured to be turned on or off in response to a voltage level at the data line;
   a second switch configured between the data line and a supply reference voltage and configured to be turned on or off in response to the voltage level at the data line; and a third switch connected in series with the first switch and configured to be turned on or off in response to a control signal, wherein the control signal is configured to cause the third switch to be turned off during a first time period larger than a second time period the voltage level at the data line is caused to be pulled down by the turned-on second switch and smaller than a third time period the voltage level at the data line is pulled down by the turned-off second switch.

7. The circuit of claim 6, wherein the first time period is shorter than a time period a memory cell is electrically coupled to the data line for accessing the memory cell.

8. The circuit of claim 6, wherein the voltage level at the data line is pulled down when the voltage level at the data line is below a voltage threshold crossing which the first switch and the second switch change states.

9. The circuit of claim 6 further comprising a charging device configured to charge the data line.

10. The circuit of claim 6 further comprising a digital circuit including an input electrically coupled to the data line and an output electrically coupled to the first switch and the second switch.

11. A memory macro comprising:
a first data line;
a second data line;
a first switch configured between the first data line and the second data line; and
a voltage keeper electrically coupled to the second data line,
wherein the voltage keeper is configured to control a voltage level at the second data line in response to the voltage level at the second data line during the first switch electrically couples the second data line to the first data line.

12. The memory macro of claim 11, wherein the voltage keeper comprises
a first switch configured between the second data line and a supply voltage and configured to be turned on or off in response to the voltage level at the second data line; and
a second switch configured between the data line and a supply reference voltage and configured to be turned on or off in response to the voltage level at the second data line.

13. The memory macro of claim 12, wherein the voltage keeper further comprises:
a third switch connected in series with the first switch and configured to be turned on or off in response to a control signal.

14. The memory macro of claim 13, wherein the control signal is configured to cause the third switch to be turned off during a first time period larger than a second time period the voltage level at the second data line is caused to be pulled down by the turned-on second switch and smaller than a third time period the voltage level at the data line is pulled down by the turned-off second switch.

15. The memory macro of claim 14, wherein the first time period is shorter than a time period the first switch electrically couples the second data line to the first data line.

16. The memory macro of claim 14, wherein the voltage level at the second data line is pulled down when the voltage level at the second data line is below a threshold voltage crossing which the first switch and the second switch change states.

17. The memory macro of claim 11, wherein the first switch is configured to electrically couple the second data line to the first data line when a memory cell of the memory macro associated with the first data line is accessed.

18. The memory macro of claim 16, further comprises a second switch configured between a third data line and the second data line.

19. The memory macro of claim 16 further comprising at least one intermediate data line between the first data line and the second data line.

20. The memory macro of claim 19 wherein the first switch is configured between one of the at least one intermediate data line and the second data line.

* * * * *